United States Patent
Tong et al.

(10) Patent No.: US 7,581,666 B2
(45) Date of Patent: Sep. 1, 2009

(54) WIRE-BONDING METHOD FOR WIRE-BONDING APPARATUS

(75) Inventors: Ho-Ming Tong, Taipei (TW);
Teck-Chong Lee, Kaohsiung (TW);
Chao-Fu Weng, Tainan (TW);
Chian-Chi Lin, Tainan (TW); Chih-Nan Wei, Kaohsiung (TW); Song-Fu Yang, Kaohsiung (TW); Chia-Jung Tsai, Tainan (TW); Kao-Ming Su, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 152 days.

(21) Appl. No.: 11/905,868

(22) Filed: Oct. 5, 2007

(65) Prior Publication Data
US 2008/0102539 A1     May 1, 2008

(30) Foreign Application Priority Data
Oct. 30, 2006   (TW) ............................... 95140096 A

(51) Int. Cl.
*B23K 31/12*   (2006.01)
*B23K 20/00*   (2006.01)
*B23K 31/00*   (2006.01)

(52) U.S. Cl. .................... 228/103; 228/102; 228/110.1; 228/180.5; 228/904

(58) Field of Classification Search ............. 228/180.5, 228/110.1, 1.1, 4.5, 904, 102, 103; 156/64, 156/73.1–73.4, 358, 580.1; 438/617
See application file for complete search history.

(56) References Cited

U.S. PATENT DOCUMENTS

| | | | | |
|---|---|---|---|---|
| 3,840,169 A | * | 10/1974 | Steranko et al. | 228/4.1 |
| 5,316,204 A | * | 5/1994 | Takehashi et al. | 228/179.1 |
| 5,516,023 A | * | 5/1996 | Kono | 228/4.5 |
| 5,791,549 A | * | 8/1998 | Ito | 228/1.1 |
| 5,839,640 A | * | 11/1998 | Kinnaird | 228/4.5 |
| 5,944,249 A | * | 8/1999 | Macabitas et al. | 228/180.5 |
| 6,182,882 B1 | * | 2/2001 | Hortaleza et al. | 228/4.5 |
| 6,572,001 B2 | * | 6/2003 | Wong et al. | 228/4.5 |
| 6,629,013 B2 | * | 9/2003 | Koduri et al. | 700/121 |
| 6,749,100 B2 | * | 6/2004 | Wong et al. | 228/4.5 |
| 7,029,929 B1 | * | 4/2006 | Lu et al. | 438/7 |
| 7,320,423 B2 | * | 1/2008 | Suresh et al. | 228/4.5 |
| 2008/0035706 A1 | * | 2/2008 | Tong et al. | 228/112.1 |

* cited by examiner

*Primary Examiner*—Jessica L Ward
*Assistant Examiner*—Carlos Gamino
(74) *Attorney, Agent, or Firm*—Bacon & Thomas, PLLC

(57) ABSTRACT

A wire-bonding method for a wire-bonding apparatus is provided. The wire-bonding apparatus includes at least a first wire-bonder and a second wire-bonder for respectively bonding at least several first chips in a first region and several second chips in a second region on a substrate simultaneously. The wire-bonding method includes following steps. First, initial position coordinates of the first region and the second region are obtained. Next, it is determined whether a space between the first region and the second region is greater than a predetermined space. When the space between the first region and the second region is greater than the predetermined space, the first wire-bonder and the second wire-bonder respectively bond the first chips and the second chips simultaneously.

6 Claims, 4 Drawing Sheets

WIRE-BONDING METHOD FOR WIRE-BONDING APPARATUS

This application claims the benefit of Taiwan application Serial No. 95140096, filed Oct. 30, 2006, the subject matter of which is incorporated herein by reference.

BACKGROUND OF THE INVENTION

1. Field of the Invention

The invention relates in general to a wire-bonding method for a wire-bonding apparatus, and more particularly to a wire-bonding method for a wire-bonding apparatus with at least two wire-bonders to bond chips in different regions on one substrate simultaneously.

2. Description of the Related Art

In the present semiconductor industry, the demand for the manufacturing process is directed toward the high-speed manufacturing process for packaging compact packages with high density. Therefore, the package structures and packaging technology are developed rapidly, and the efficiency of the packaging facilities is improved continuously.

Take the wire-bonding process which is often used in the present manufacturing process for example. The wire-bonding process is performed on the wire-bonding apparatus to bond high-density chips fast, precisely and continuously. Conventionally, only one wire-bonding apparatus bonds the chips in one production line. The time of the wire-bonding process cannot be reduced when the production lines cannot be expanded due to the limited factory area.

SUMMARY OF THE INVENTION

The invention is directed to a wire-bonding method for a wire-bonding apparatus for bonding chips in different regions on one substrate simultaneously. The efficiency of the wire-bonding process is increased significantly, and the yield rate per unit time is increased accordingly.

According to the present invention, a wire-bonding method for a wire-bonding apparatus is provided. The wire-bonding apparatus includes at least a first wire-bonder and a second wire-bonder for bonding at least several first chips in a first region and several second chips in a second region. The wire-bonding method includes following steps. First, initial coordinates of the first region and the second region are obtained. Next, it is determined whether a space between the first region and the second region is greater than a predetermined space. When the space between the first region and the second region is larger than the predetermined space, the first wire-bonder and the second wire-bonder respectively bond the first chips and the second chips simultaneously. When the space between the first region and the second region is less than the predetermined space, the second wire-bonder moves away from the first wire-bonder and to be positioned over a third region with several third chips. The first wire-bonder and the second wire-bonder respectively bond the first chips and the third chips simultaneously.

The invention will become apparent from the following detailed description of the preferred but non-limiting embodiments. The following description is made with reference to the accompanying drawings.

DETAILED DESCRIPTION OF THE INVENTION

Figure 1:
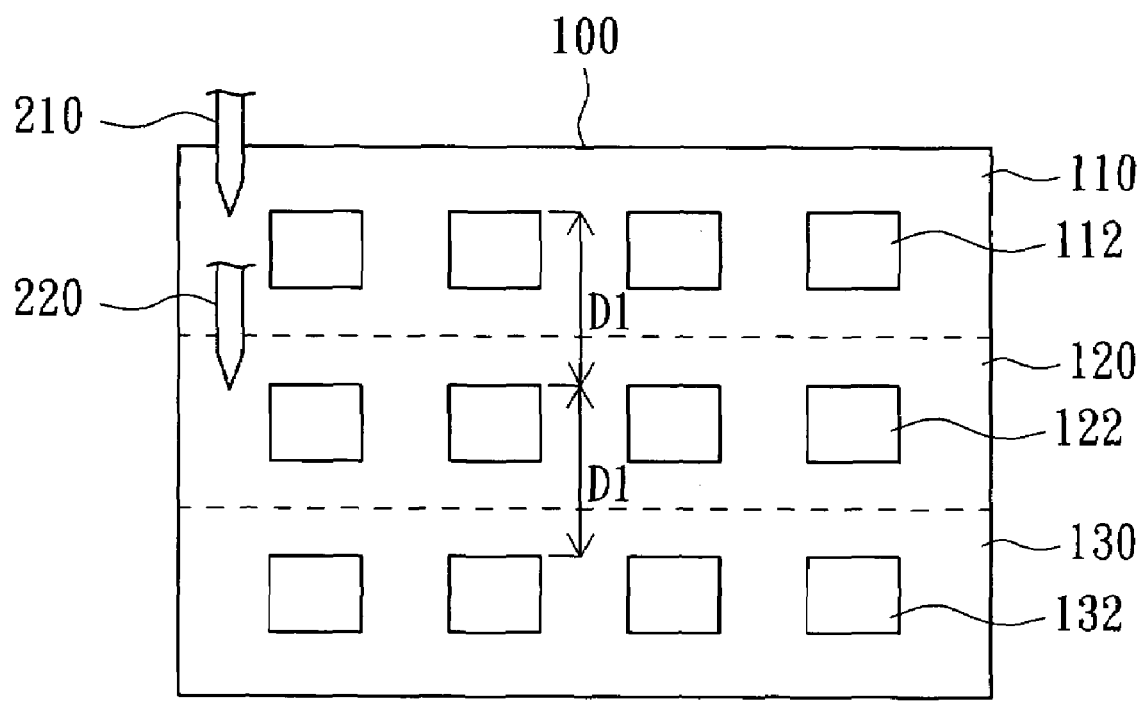
FIG. 1 illustrates wire-bonders and chips on a substrate according to a first example of the present invention.

FIG. 1 illustrates wire-bonders and chips on a substrate according to a first example of the present invention. Please referring to FIG. 1, a wire-bonding apparatus of the present invention includes at least a first wire-bonder 210 and a second wire-bonder 220 for respectively bonding at least several first chips 112 in a first region 110 and several second chips 122 in a second region 120 simultaneously. The first region 110, the second region 120 and a third region 130 in FIG. 1 are in different rows of the substrate 100. The first chips 112, the second chips 122 and third chips 132 are respectively arranged in a line in the first region 110, the second region 120 and the third region 130. The space D1 is between the first chips 112 and the second chips 122 and also between the second chips 122 and the third chips 132.

Figure 2:
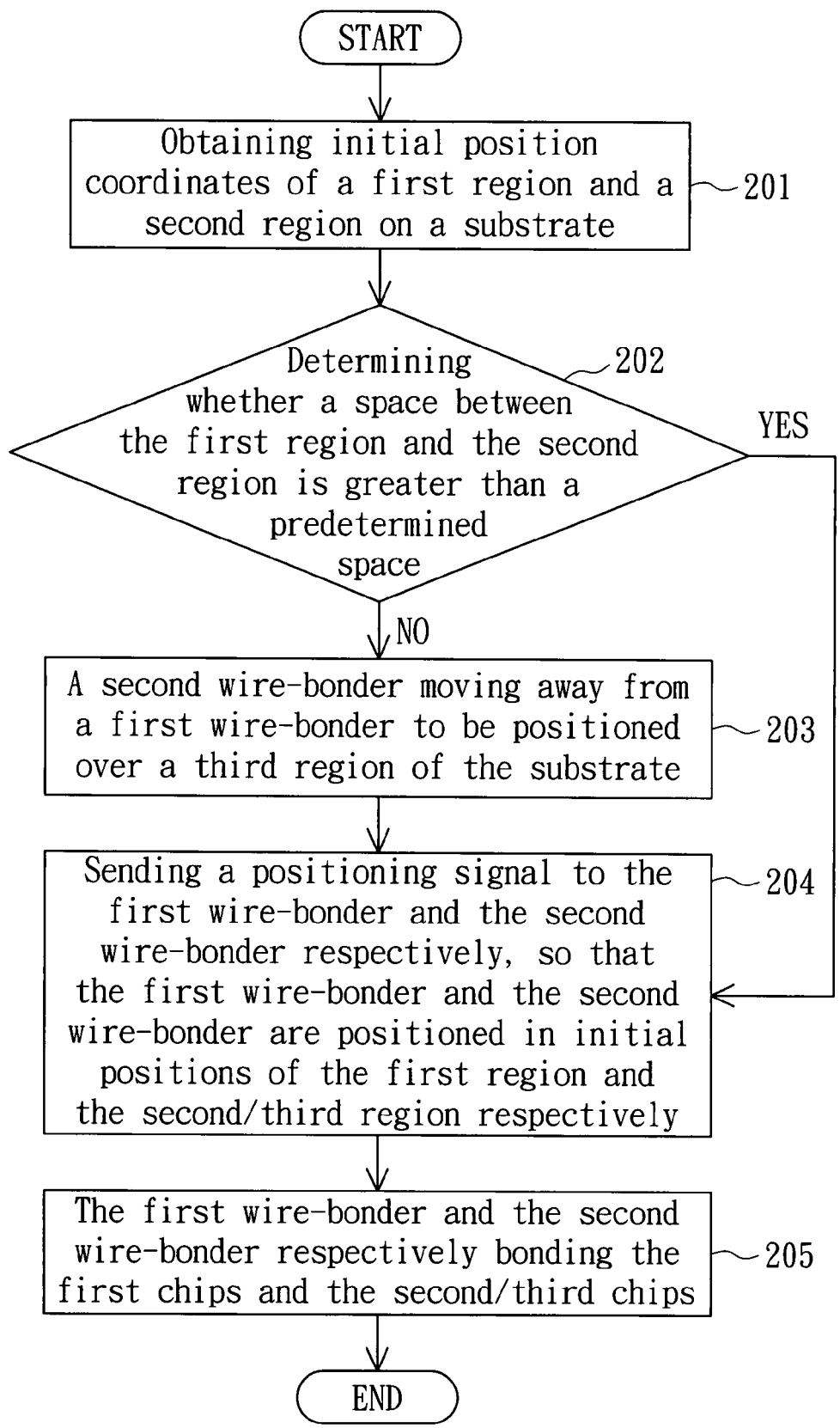
FIG. 2 is a flow chart of a wire-bonding method of the present invention.

FIG. 2 is a flow chart of a wire-bonding method of the present invention. Please refer to both FIG. 1 and FIG. 2. First, in a step 201, initial position coordinates of the first region 110 and the second region 120 are obtained.

Next, in a step 202, it is determined whether the space between the first region 110 and the second region 120 is greater than a predetermined space by a processing unit of the wire-bonding apparatus. The space between the first region 110 and the second region 120 is the same as the space D1 between the first chips 112 and the second chips 122. This step is to ensure a safe distance is maintained between the first wire-bonder 210 and the second wire-bonder 220, so that the wire-bonders do not collide with each other in the wire-bonding process.

When the space between the first region 110 and the second region 120 is less than the predetermined space, the second wire-bonder 220 moves away from the first wire-bonder 210 and to be positioned over the third region 130 of the substrate 100 in a step 203. The third chips 132 are located in the third region 130.

Then, in a step 204, the processing unit sends a positioning signal to the first wire-bonder 210 and the second wire-bonder 220 respectively, so that the first wire-bonder 210 and the second wire-bonder 220 are positioned in initial positions of the first region 110 and the third region 130 respectively.

Afterwards, in a step 205, the first wire-bonder 210 and the second wire-bonder 220 respectively bond the first chips 112 and the third chips 132 simultaneously.

When the space D1 between the first region 110 and the second region 120 is greater than the predetermined space in the step 202, the method goes to a step 204 directly. In other words, the space D1 between the first chips 112 and the second chips 122 is greater than the predetermined space. The processing unit sends a positioning signal to the first wire-bonder 210 and the second wire-bonder 220 respectively, so that the first wire-bonder 210 and the second wire-bonder 220 are positioned in initial positions of the first region 110 and the second region 120 respectively. Next, in the step 205, the first wire-bonder 210 and the second wire-bonder 220 respectively bond the first chips 112 and the second chips 122 simultaneously.

Figure 3:
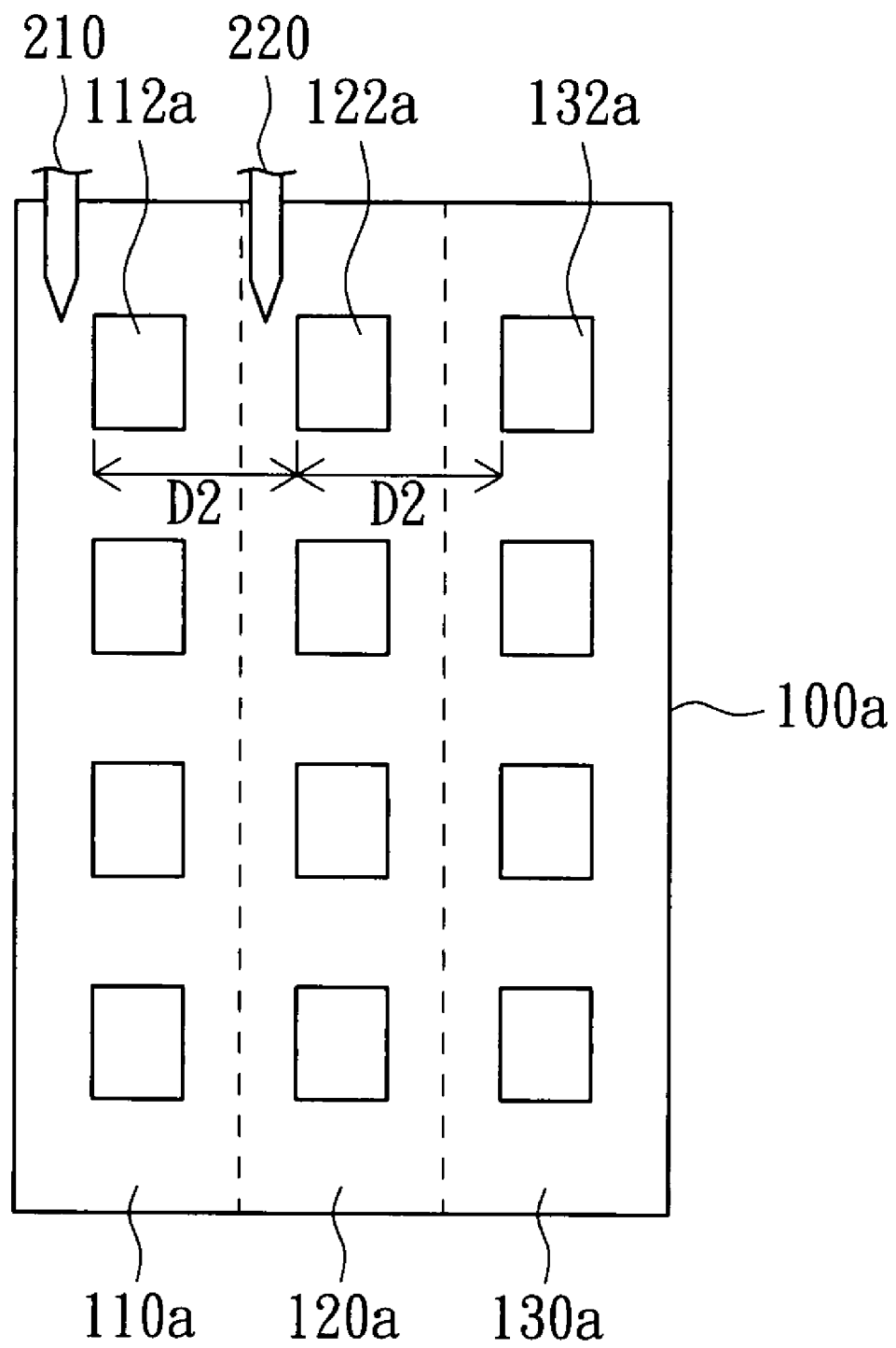
FIG. 3 illustrates the wire-bonders and the chips on the substrate according to a second example of the present invention.

However, anyone who has ordinary skill in the field of the present invention can understand that the present invention is not limited thereto. FIG. 3 illustrates the wire-bonders and the chips on the substrate according to a second example of the present invention. The first region 110a, the second region 120a and the third region 130a are in different columns on the substrate 100a. The first chips 112a, the second chips 122a and the third chips 132a are respectively arranged in a line in the first region 110a, the second region 120a and the third region 130a. The space D2 is between the first chips 112a and the second chips 122a, and also between the second chips 122a and the third chips 132a. Therefore, the above wire-bonding method can be applied to chips arranged according to the present example. The processing unit of the wire-bonding apparatus determines whether the space D2 is greater than the predetermined space in order to decide whether the second wire-bonder 210 moves to the next region, such as the third region 130a. When a safe distance is maintained between the first wire-bonder 210 and the second wire-bonder 220, the first wire-bonder 210 and the second wire-bonder 220 respectively bond chips in different regions simultaneously.

Figure 4:
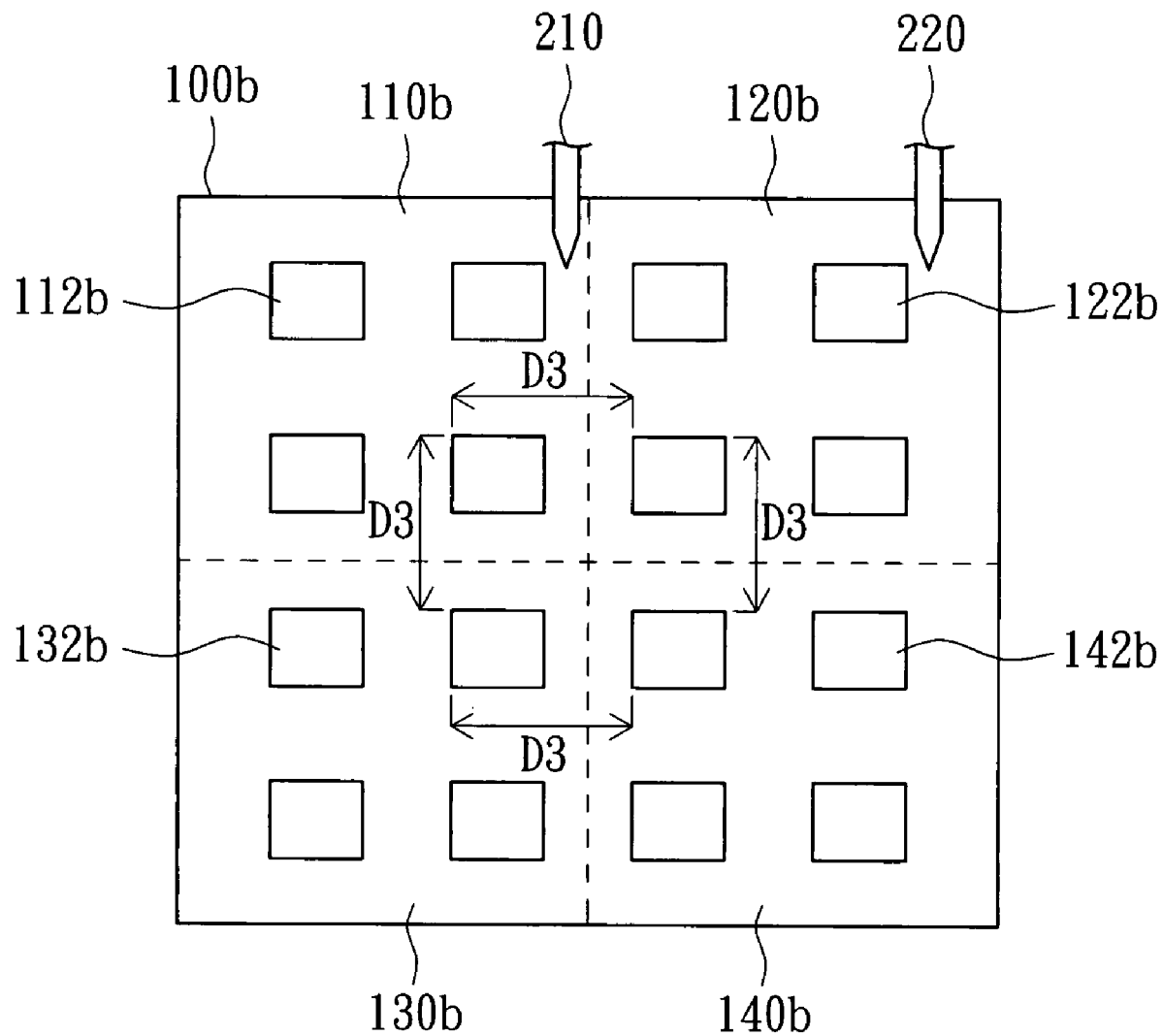
FIG. 4 illustrates the wire-bonders and the chips on the substrate according to a third example of the present invention.

FIG. 4 illustrates the wire-bonders and the chips on the substrate according to a third example of the present invention. Please referring to FIG. 4, the first region 110b, the second region 120b, the third region 130b and a fourth region 140b are on the substrate 100b. The first chips 112b, the second chips 122b, the third chips 132b and fourth chips 142b are respectively arranged in 4×4 array in the first region 110b, the second region 120b, the third region 130b and the fourth region 140b. The chips in each region are separated from the chips in other regions at a space D3. Therefore, the above wire-bonding method can be applied to chips arranged according to the present example. Furthermore, the number of chips in each array is not necessarily the same. When the processing unit determines that the space D3 between the chips is less than the predetermined space, the first wire-bonder 210 and the second wire-bonder 220 may collide with each other in the wire-bonding process. Then, the second wire-bonder 220 moves away from the first wire-bonder 210 to another region. When a safe distance is maintained between the first wire-bonder 210 and the second wire-bonder 220, the first wire-bonder 210 and the second wire-bonder 220 respectively bond the chips simultaneously.

Moreover, the wire-bonding apparatus preferably further includes a database for storing operating parameter data. The operating parameter data includes chip arrangement, number of chips, chip size and initial position coordinates. Also, the predetermined space can be stored in the database, so that the processing unit determines whether a safe distance is maintained between the first wire-bonder 210 and the second wire-bonder 220 accordingly.

Besides, the number of the wire-bonders, the shape of the regions, and the number of the chips in each region are not limited in the present embodiment. The present invention encompasses such modifications as long as at least two wire-bonders respectively bond chips in different regions of the substrate simultaneously.

In the wire-bonding method for the wire-bonding apparatus of the present invention, at least two wire-bonders respectively bond chips in different regions simultaneously. As a result, the wire-bonding efficiency in the single production line is increased significantly, and the yield rate per unit time is increased greatly. The wire-bonding apparatus adjusts the distance between the wire-bonders in different regions, so that the wire-bonders do not collide with each other in the wire-bonding process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wire-bonding method for a wire-bonding apparatus, the wire-bonding apparatus comprising at least a first wire-bonder and a second wire-bonder, for bonding at least a plurality of first chips in a first region and a plurality of second chips in a second region simultaneously, the method comprising:
   (a) obtaining initial position coordinates of the first region and the second region;
   (b) determining whether a space between the first region and the second region is greater than a predetermined space; and
   (c) when the space between the first region and the second region is greater than the predetermined space, the first wire-bonder and the second wire-bonder respectively bond the first chips and the second chips simultaneously; when the space between the first region and the second region is less than the predetermined space, the second wire-bonder moves away from the first wire-bonder to a third region with a plurality of third chips, the first wire-bonder and the second wire-bonder respectively bond the first chips and the third chips simultaneously.

2. The method according to claim 1, wherein the wire-bonding apparatus further comprises a processing unit for sending a positioning signal to the first wire-bonder and the second wire-bonder respectively in the step (c), so that the first wire-bonder and the second wire-bonder are respectively positioned in initial positions of the first region and the second or the third region.

3. The method according to claim 1, wherein the first chips, the second chips and the third chips are arranged in a line respectively.

4. The method according to claim 1, wherein the first chips, the second chips and the third chips are arranged in an array respectively.

5. The method according to claim 1, wherein the wire-bonding apparatus further comprises a database for storing operating parameter data.

6. The method according to claim 5, wherein the operating parameter data comprises chip arrangement, number of chips, chip size and initial position coordinates.

* * * * *